United States Patent [19]

Shibasaki et al.

[11] 4,251,795
[45] Feb. 17, 1981

[54] SEMICONDUCTOR MAGNETORESISTIVE ELEMENT HAVING A DIFFERENTIAL EFFECT

[75] Inventors: Ichiro Shibasaki; Kaoru Ohmura; Takeo Kimura, all of Fuji, Japan

[73] Assignee: Asahi Kasei Kogyo Kabushiki Kaisha, Osaka, Japan

[21] Appl. No.: 964,554

[22] Filed: Nov. 29, 1978

[30] Foreign Application Priority Data

Nov. 29, 1977 [JP] Japan .................... 52-142240

[51] Int. Cl.³ ............................ H01L 43/08
[52] U.S. Cl. ........................ 338/32 R; 323/368; 324/252
[58] Field of Search ........ 338/32 R, 32 H; 324/25, 324/252; 360/113

[56] References Cited

U.S. PATENT DOCUMENTS

| | | | |
|---|---|---|---|
| 3,691,502 | 9/1972 | Kataoka | 338/32 R |
| 3,731,007 | 5/1973 | Masuda et al. | 338/32 R X |
| 3,852,103 | 12/1974 | Collins et al. | 338/32 R X |
| 3,921,217 | 11/1975 | Thompson | 360/113 |

FOREIGN PATENT DOCUMENTS 2614165 10/1976 Fed. Rep. of Germany ........... 360/113

OTHER PUBLICATIONS

S. D. Chectham, et al., *IBM Technical Disclosure Bulletin*, "Magneto-resistive Head Element", vol. 19, No. 7, pp. 2430-2431, Dec. 1976.

*Primary Examiner*—C. L. Albritton
*Attorney, Agent, or Firm*—Sprung, Felfe, Horn, Lynch & Kramer

[57] ABSTRACT

A semiconductor magnetoresistive element with at least one intermediate terminal comprises first and second electrodes formed at opposite ends of a magnetosensitive portion of the semiconductor magnetoresistive element, a third electrode interposed between the first and second electrodes, and a plurality of shorting bars disposed, with electrical isolation from each other, on at least one of respective sections of the magnetosensitive portion between the first and third electrodes and between the second and third electrodes, whereby the magnetic sensitivity characteristic of the magnetosensitive section between the first and third electrodes is rendered different from that of the magnetosensitive section between the second and third electrodes.

18 Claims, 12 Drawing Figures

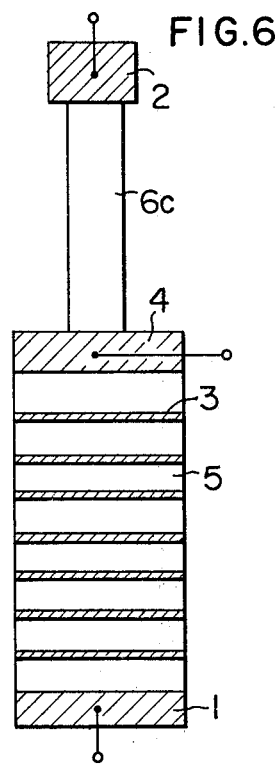
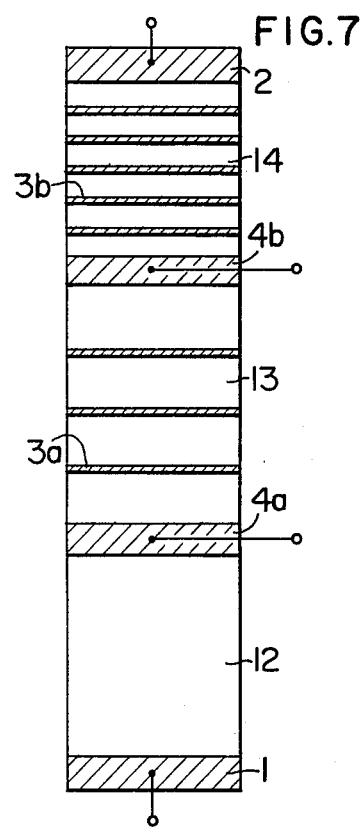
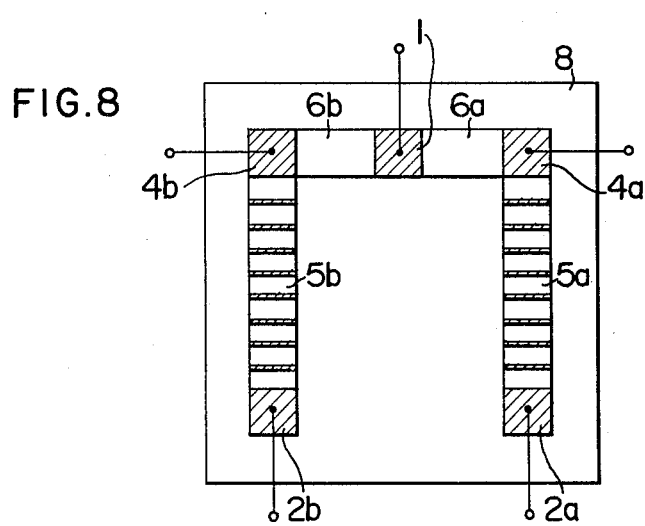

SEMICONDUCTOR MAGNETORESISTIVE ELEMENT HAVING A DIFFERENTIAL EFFECT

BACKGROUND OF THE INVENTION

The present invention relates to magnetoresistive elements having a differential effect and more particularly, a semiconductor magnetoresistance device provided with at least three terminals and making use of magnetoresistive effect.

A conventional semiconductor magnetoresistive element comprises, as shown in FIG. 1, a current-carrying magnetoresistive (magnetic field sensitive) portion 5 in the form of an oblong semiconductor plate or thin film and a pair of electrodes 1 and 2 provided at the opposite ends of the magnetosensitive portion, in which the resistance between the electrodes 1 and 2 of the element is changed by applying a magnetic field to the magnetosensitive portion 5. In order to increase the rate of change in the resistance or application of the magnetic field in the magnetroresistive element, metal electrode bars in ohmic contact with a semiconductor body constituting the magnetoresistive portion are usually used to short the Hall voltage. The electrode bar is called a shorting bar. The shorting bars are made of conducting material and are aligned between input and output electrodes 1 and 2 on the semiconductor body at right angles to the direction of current flow as indicated by 3 in FIG. 1. The shorting bars 3 segment the magnetosensitive portions to form small regions. A ratio l/w between a length l and a width w of the segmental region is reduced to obtain the maximum shorting effect for the Hall voltage. The segmental regions are electrically connected in series to complete a unitary element. As the ratio l/w is reduced, the resistance of the semiconductor element is increased in square proportion to a low applied magnetic field but in direct proportion to a high applied magnetic field, irrespective of the direction of the applied magnetic fields.

Another magnetoresistive element is also known using an InSb material containing acicular, low resistivity NiSb. The NiSb crystal acts as shorting bars, offering similar characteristics.

However, with the conventional magnetoresistive element having the electrodes only at the opposite ends, the resistance in the absence of the applied magnetic field varies with temperatures and hence, when placing the element into operation, it is necessary to compensate the variation in resistance due to temperatures by means of an external circuit. For example, two discrete elements are used in combination, in which these elements are connected in series to produce a differential output.

Accordingly, additional separate parts and interconnecting means therefor are required to compensate the temperature dependence of the resistance. In the application to devices such as a contactless micro-switch and a contactless potentiometer, these elements suffer not only the increased number of separate parts but also necessity of IC (integrated circuit) parts associated therewith, resulting in a bulky device. Without the compensation of the temperature dependence a strict restriction will be imposed on the application of the magnetoresistive element since the element is allowed to be operated only in a substantially constant ambient temperature.

An approach has been proposed as disclosed, for example, in Japanese Laid-open Patent Application No. 53-8180 laid open to public on Jan. 25, 1978 (Japanese Patent Application No. 51-82125 filed on July 10, 1976), in which two magnetoresistive elements are formed on a substrate in a unitary fashion and a magnetic field is applied to only one of the elements to produce a differential output. With this approach, if the magnetic field is applied to both the elements, respective elements equally change their resistances, and therefore, it results in no differential output. Thus, it is necessary to apply the magnetic field to only one of the elements to produce a differential output. In addition, a utilization device incorporating such unitary element inevitably becomes bulky.

As a countermeasure therefor, a three-terminal element as shown in FIG. 2 is known, in which a magnetic field may be applied to an overall element. As diagrammatically shown in FIG. 2, two thin film magnetosensitive portions are disposed on one surface of a substrate 8 in such a manner that they are geometrically perpendicular to each other. A power supply E is connected between electrodes 1 and 2 of the element. By applying a magnetic field parallel to the substrate a differential output $V_{out}$ with small temperature dependence can be developed at an intermediate electrode 4. This arrangement, however, is inherent and specified to a ferromagnetic magnetoresistive element constituted by a magnetosensitive portion made of a ferromagnetic material and hence cannot be applied to semiconductor magnetoresistive elements.

The variation in the resistance of semiconductor magnetoresistive element due to temperatures has long been taken little account of by the conventional technique because of its inherent dependency upon the characteristics of the semiconductor material used for the magnetosensitive portion.

SUMMARY OF THE INVENTION

An object of this invention is to provide a semiconductor magnetoresistive element with a substantially temperature dependence-free output characteristic.

Another object of this invention is to provide a semiconductor magnetoresistive element having at least three terminals which is capable of producing a differential output using a shorting bar pattern.

A still other object of this invention is to provide a semiconductor magnetoresistive element having a magnetosensitive portion including a shorting bar patterned section and a non-patterned section with an output terminal at the boundary of these sections, whereby respective sections have different magnetic sensitivities, or different magnetoresistances.

Another object of this invention is to provide a small-sized, semiconductor magnetoresistive element having a large geometrical magnetoresistive effect.

The present invention is based on the fact experienced by the inventors that when a magnetic field is applied to the entirety or a portion of a semiconductor magnetoresistive element having a selective arrangement of the shorting bar pattern, input terminals to electrodes provided at the opposite ends of a magnetosensitive portion of the element and an output terminal from a third electrode interposed between both the input electrodes, a differential output which has greatly reduced dependency upon temperatures can be obtained.

Specifically, a semiconductor magnetoresistive element according to the present invention comprises a high electron mobility semiconductor region provided on one surface of a substrate for providing a magnetosensitive portion, first and second electrodes coupled to the semiconductor region at its opposite ends in ohmic contact therewith to serve as input terminals, a third ohmic-contact electrode coupled to the semiconductor region between the first and second electrodes to serve as an output terminal, and a plurality of shorting bars disposed, with electrical isolation from each other, on at least one of respective areas between the first and third electrodes and between the second and third electrodes of the semiconductor region, whereby on application of a magnetic field to the magnetosensitive portion, the rate of change in the resistance due to the magnetoresistive effect between the first and third electrodes of the element is different from that between the second and third electrodes.

Other objects, features and advantages of the present invention will become apparent from the following description of the embodiments of the invention when taken in conjunction with the accompanying drawings.

BRIEF DESCRIPTION OF THE DRAWINGS

FIGS. 6 to 8 are sectional views showing other different semiconductor magnetoresistive elements embodying the present invention.

In the following description, like portions and members are designated by the same reference numerals. The term "electrode" used herein is distinctive from "shorting bar".

DESCRIPTION OF THE PREFERRED EMBODIMENTS

Figure 1:
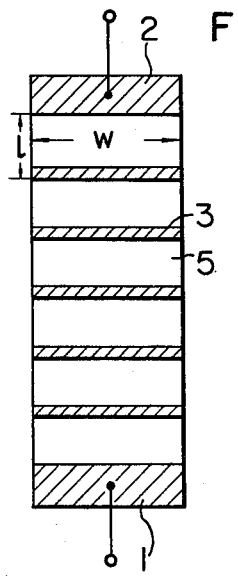
FIG. 1 is a schematically diagrammatic view showing one example of a prior art semiconductor magnetoresistive element.
Figure 2:
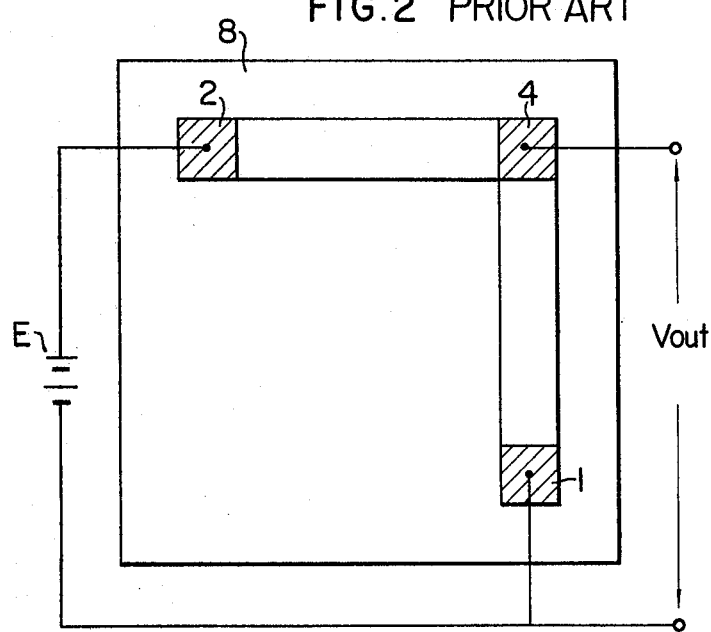
FIG. 2 is a schematically diagrammatic view showing one example of a prior art three-terminal ferromagnetic magnetoresistive element.
Figure 3A:
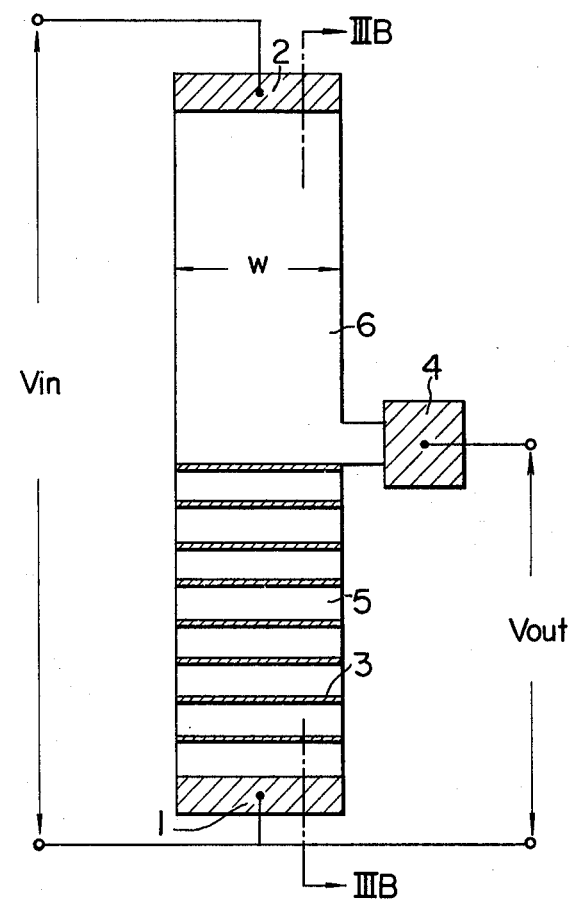
FIG. 3A is a plan view of a semiconductor magnetoresistive element showing the basic construction of the present invention.
Figure 3B:
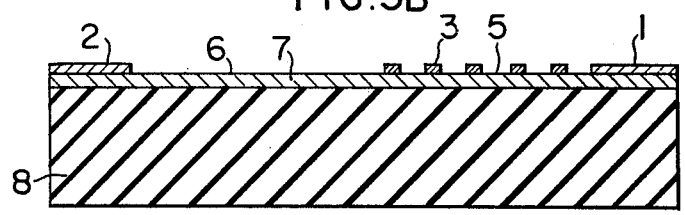
FIG. 3B is a longitudinal sectional view taken on line IIIB—IIIB in FIG. 3A.

FIGS. 3A and 3B are a plan view and a sectional view, respectively, showing the basic construction of a semiconductor magnetoresistive element according to the present invention. As shown therein, a thin film layer or thin plate 7 made of a high electron mobility semiconductor material is formed on an insulating substrate 8, constituting a magnetosensitive portion in the form of a substantial strip, and a first electrode 1 and a second electrode 2 are in ohmic contact with magnetosensitive portion at its opposite ends. A third electrode 4 makes ohmic connection to an intermediate location of the magnetoresistive portion between the first and second electrodes. The magnetosensitive portion of the element consists of a magnetosensitive section 5 between the first and third electrodes 1 and 4 having a pattern of shorting bars 3 and another magnetosensitive section 6 between the second and third electrodes 1 and 4 having no shorting bar pattern.

Figure 3C:
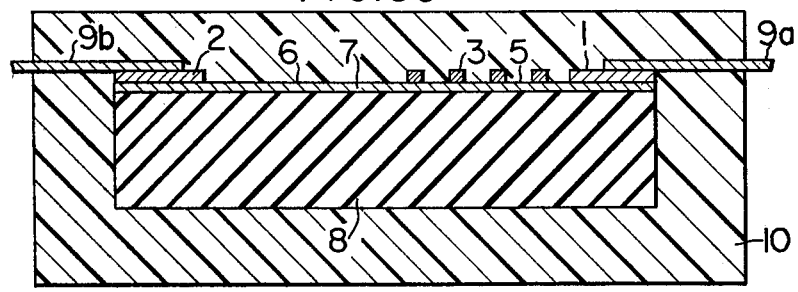
FIG. 3C is a sectional view showing an exemplary mold packaging of the element shown in FIG. 3A.

The element of the above construction is sealed with resin to complete a product as exemplified and illustrated in section in FIG. 3C. Lead wires e.g., connecting pins 9a and 9b are bonded to the electrodes 1 and 2, respectively, and the resulting assembly is molded with resin 10. A lead wire, not shown, is also taken out from the electrode 4 in a similar manner.

Now, description will be given in brevity to explain one example of a method of manufacturing the semiconductor magnetoresistive element having the construction shown in FIGS. 3A to 3C.

A layer 7 of a semiconductor thin plate or film is first formed on an insulating substrate 8 by cutting and evaporation or sputtering of a single crystalline material. The semiconductor thin plate or film is then patterned into a desired configuration by, for example, photoetching, if so desired. Next, the electrodes 1, 2 and 4 and shorting bars 3 are attached to the layer 7 by pattern evaporation or pattern plating using a photomask (FIGS. 3A and 3B). Thereafter, lead wires are bonded to the respective electrodes by wire bonding or solder bonding and the resulting assembly is preferably molded with, for example, epoxy resin, thus completing a three-terminal element of the present invention (FIG. 3C).

Instead of being formed on the surface of the semiconductor layer 7, the respective electrodes may be embedded therein. Further, at least the element pattern on the substrate or the element and substrate in combination may be molded with other resin, glass or ceramic to form a protective layer.

Operation and function of the three-terminal semiconductor magnetoresistive element will now be described.

Figure 4:
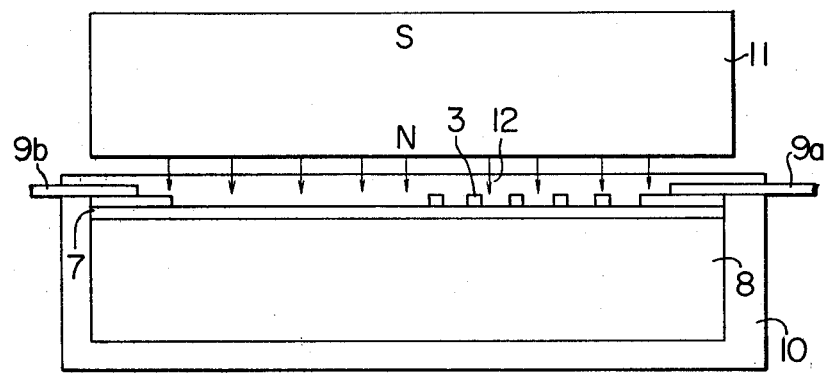
FIG. 4 is a sectional view to explain the operation of the element shown in FIG. 3A.

When a predetermined voltage is applied between the first and second electrodes 1 and 2 at the opposite ends of the three-terminal magnetoresistive element, the third electrode 4 assumes a potential which is determined by a ratio between resistances of the magnetosensitive sections 5 and 6. And, the potential appearing at the third electrode changes when a magnetic field 12 is applied to the element from a magnetic field generator e.g., a permanent magnet 11 as shown in FIG. 4 since there occur different changes in resistances in the magnetosensitive sections 5 and 6. Namely, the magnetosensitive section 5 provided with the shorting bars 3 changes its resistance at a larger rate than at the magnetosensitive section 6 on application of the magnetic field, so that the ratio of resistances between the magnetosensitive sections 5 and 6 changes depending on the presence and absence of the magnetic field. In this manner, the potential at the third electrode changes on application of a magnetic field.

In brevity, the three-terminal magnetoresistive element according to the present invention produces an output $V_{out}$ which is defined as the difference between the potential appearing at the third electrode when the magnetic field is not applied to the magnetosensitive portion and that appearing at the third electrode when the magnetic field is applied to the magnetosensitive portion under the condition that a constant voltage $V_{in}$ is applied between the first and second electrodes.

In the element of the present invention having the above construction, temperature dependency of the output is attributable only to temperature dependency of the electron mobility of a semiconductor material constituting the magnetosensitive portion. Generally, in a semiconductor material used for magnetoresistive elements, for example, InSb or $In_xGa_yAs_z(x+y+z=1)$, the electron mobility has less temperature dependency than the Hall coefficient and the electrical conductivity. Therefore, the output of the element according to the present invention changes depending on temperatures to the same extent, at the most, as the electron mobility of the semiconductor material constituting the magnetosensitive portion and generally, it has less temperature dependency than the electron mobility, meeting practical purposes.

Take an InSb single crystal, for example, the electron mobility changes at a rate of 0.5%/°C. and the electrical conductivity changes at a rate of 3%/C.° around room temperature. Accordingly, the output of the element according to the present invention changes at a rate of 0.5%/C.° at most around room temperature and this rate is smaller by an order of one tenth than a rate of change in the resistance of the conventional element which is 3%/C.°. Namely, in the element according to the present invention, the output voltage (divided voltage) from the third electrode 4 serving as output electrode is considerably decreased in its temperature dependency.

In connection with the characteristic of the semiconductor material used for the element according to the present invention, a large electron mobility which is of small temperature dependency is preferred.

From this standpoint, as the semiconductor material used for the element according to the present invention, a compound semiconductor or an eutectic alloy of III group and V group elements in the periodic table, Si or Ge is preferred. Thus, a semiconductor material containing, as a main composition, III group and V group elements is preferably used which typically includes InSb, InAs, InP, InBi, GaSb, GaAs, GaP, GaN, AlSb, AlAs, AlP, NiSb, $InAs_xP_{1-x}$ (0<x<1), an eutectic substance of InSb and NiSb, an eutectic substance of InSb and In, $In_xSb_yGa_z$ (x+y+z=1), and a ternary eutectic substance of $In_xSb_ySn_z$ (x+y+z=1). In addition thereto, Si and Ge are also materials to be preferably used. In using these materials, it is general to add suitable impurities to them.

For the intended usage, the aforementioned material may take any form of a single crystal, polycrystal, amorphous substance, eutectic substance, and mixed crystal but may preferably used in the form of a single crystal, polycrystal, eutectic substance or mixed crystal.

Such a semiconductor body is shaped into a thin plate or thin film.

The magnetosensitive portion of the element according to the present invention, for example, consisting of the magnetosensitive sections 5 and 6 as illustrated in FIGS. 3A and 3B is fabricated as a unitary or integral member made of the same semiconductor material to ensure that the temperature dependency of the magnetosensitive portion is minimized and desirably nullified. If the magnetosensitive sections are made of different semiconductor materials, it is preferable that these semiconductor materials have the same characteristic, especially on the temperature characteristic.

The configuration of the element according to the present invention is not limited to one shown in FIG. 3A. For example, the magnetosensitive section 6 as shown in FIG. 3A may also be provided with shorting bars in a different pattern from that of the magnetosensitive section 5 so that the magnetosensitive sections 5 and 6 have different magnetic characteristics, that is, different rates of change in the resistance on application of a magnetic field. Practically, however, it is possible to obtain a large differential output without providing unnecessarily additional shorting bars and it is sufficient and preferable to provide a plurality of shorting bars either between the first and third electrodes 1 and 4 or between the second and third electrodes 2 and 4.

A plurality of shorting bars are made of a metallic material which has conventionally been known of its ability to make ohmic contact with the semiconductor layer 7 of the element. The shorting bars are patterned such that they are geometrically and electrically isolated from each other. This metallic material may include copper, silver, platinum, palladium, aluminum, indium, bismuth, alloys of these metals and a multi-layer of these metals but is not limited to the substances as described immediately above. The shorting bar may take the form of a thin film or a rod.

It will be appreciated that the shorting bars are arranged either at one section between the first and third electrodes or at the other section between the second and third electrodes to ensure that these sections have different sensitivities to the magnetic field, that is to say, undergo different rates of change in the resistance. For example, if one section between the first and third electrodes is made of an InSb material having acicular crystals of NiSb acting as the shorting bars, the other section between the second and third electrodes cannot be removed of the acicular crystals of NiSb. Accordingly, such InSb material cannot be used in the present invention because the different sensitivities to the magnetic field as intended herein cannot be achieved. In the present invention, the shorting bars may be so patterned as to allow the section carrying them to change its sensitivity to the magnetic field. For this purpose, it is sufficient to pattern the shorting bars such that their lengths lie in a direction transverse to the current path of the element. In other words, the shorting bars may lie in a direction crossing the current path, being not parallel thereto. The shorting bars are not always required to cross the current path of the element at right angles thereto as shown in FIG. 3A but may cross the current path obliquely. However, the shorting bars lying across the current path at right angles thereto function more effectively.

It is not always necessary to make constant the length of respective shorting bars and the spacing between adjacent shorting bars. For the sake of ease of fabrication, the same length and the same spacing are preferred.

Employed for the first, second and third electrodes of the element according to the present invention are any materials which have the ability to make ohmic contact with the semiconductor body comprised of the magnetosensitive portion. The employment of metal is generally usual.

Specifically, Au, Ag, Al, Pt, Pd, Cu, In, Bi, Sn, Pb, an alloy, multi-layer film and fine rod of these metals are preferably used.

Figure 5:
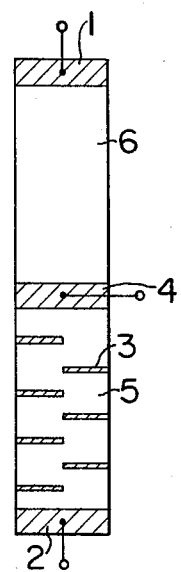
FIG. 5 is a sectional view showing a modification of the element shown in FIG. 3A.

FIG. 5 shows a modification of the element shown in FIG. 3A, in which a plurality of shorting bars 3 being provided for a magnetosensitive section 5 are patterned with different spacings and different bar lengths, a third electrode 4 is in ohmic contact with a boundary of contiguous magnetosensitive portions 5 and 6 and crosses the current path between the first and second electrodes. A lead-out wire such as Au wire is bonded directly to the third electrode. Accordingly, this modification dispenses with the provision of the extended bonding pad for the third electrode as required of the element shown in FIG. 3A.

FIG. 6 shows another embodiment of the present invention, in which a magnetosensitive section 6C not having shorting bars is made narrow to have a smaller width than that of a magnetosensitive section 5 which is of a large magnetoresistive effect, so that the area of the magnetosensitive portion occupied on the substrate surface can be decreased to thereby miniaturize the element as a whole and increase the number of the elements being integrated on a fixed area of the substrate.

A third electrode 4 may be positioned between first and second electrodes and in general in the middle of the first and second electrodes. Specifically, when the third electrode is positioned such that the resistance between the first and third electrodes 1 and 4 is made equal to the resistance between the second and third electrodes 2 and 4 in the absence of the magnetic field, the potential difference between the first and third electrodes or the potential difference between the second and third electrodes is made equal to one half the potential difference between the first and second electrodes when an applied magnetic field is zero, so offering convenience for the operation of the element according to the present invention.

The substrate used for the element according to the present invention is required of high resistivity and is preferably made of an insulating substrate or a substrate with its surface applied with insulation treatment. A semiconductor body is fixedly mounted to this substrate in intimate contact therewith to form the element. Specifically, the semiconductor body may be formed directly on the substrate or through insulative bonding agent.

Alternatively, the substrate of an insulative ferromagnetic material or a ferromagnetic material with its surface applied with insulation treatment may preferably used in order to improve the magnetic sensitivity.

In this case, as the substrate, a ferrite substrate, a soft iron plate, a permalloy plate, a silicon steel plate, or a residual magnetism-free steel plate may preferably be used.

Employed for the non-magnetic substrate are any materials generally suitable for the element substrate including resin (single layer or multi-layer), glass, quartz glass, quartz, ceramic, sapphire, mica, and steatite. The surface of substrate of the above material may be applied with a coating of resin, oxide or the like.

FIG. 7 shows a semiconductor magnetoresistive element further embodying the present invention, in which a plurality of intermediate terminal electrodes (i.e., taps) are provided between the electrodes at the opposite ends of the magnetosensitive portion of the element, and the respective intermediate terminal electrodes can develop outputs in accordance with different magnetic sensitivities on application of a magnetic field. As will be seen from FIG. 7, intermediate terminal electrodes (or taps) 4a and 4b are arranged on the magnetosensitive portion between first and second electrodes 1 and 2 to partition the magnetosensitive portion, defining a magnetosensitive section 12 having no shorting bar pattern and magnetosensitive sections 13 and 14 being provided with shorting bar patterns.

A pattern 3a of shorting bars at the magnetosensitive section 13 is made different from a pattern 3b of shorting bars at the magnetosensitive section 14 so that the two sections have different magnetic sensitivities. It will be understood that with this four-terminal magnetoresistive element, when an input voltage is applied between desired two terminal electrodes with at least one intermediate terminal electrode intervening therebetween, a substantially temperature dependency-compensated output can be developed from the intervening intermediate terminal electrode acting as an output terminal without the necessity of a selectively applied magnetic field. When the plurality of the intermediate terminal electrodes 4a and 4b are used as independent or separate output terminals, different differential output voltage, that is, different divided voltages can be taken out from the respective intermediate terminal electrodes on application of a magnetic field. The voltage division ratio can desirably be designed in accordance with parameters of the material and configuration of the magnetosensitive sections 12, 13 and 14 and the pattern of shorting bars.

FIG. 8 shows a still further embodiment of the present invention which is basically considered to comprise two of the elements shown in FIG. 3A formed integrally and in parallel on a single-chip substrate. In the figure, there are provided, on a substrate 8, magnetosensitive sections 5a and 5b provided with a plurality of shorting bars, magnetosensitive sections 6a and 6b, respectively contiguous to the sections 5a and 5b and free of shorting bar, and a plurality of electrodes 1, 2a, 2b, 4a and 4b in ohmic contact with those magnetosensitive sections and isolated from each other. It is possible to vary the magnetic sensitivity by differing the number and configuration of the shorting bars on the magnetosensitive sections 5a and 5b. This embodiment is adaptive to various applications. For example, when the electrode 1 is designated as a common electrode being grounded and different given voltages are applied to the electrodes 2a and 2b, it is possible to derive from the electrodes 4a and 4b different output voltages which are differential under an applied magnetic field. The differential outputs may be utilized to constitute contactless position sensors or non-contact proximity switches.

Figure 9A:
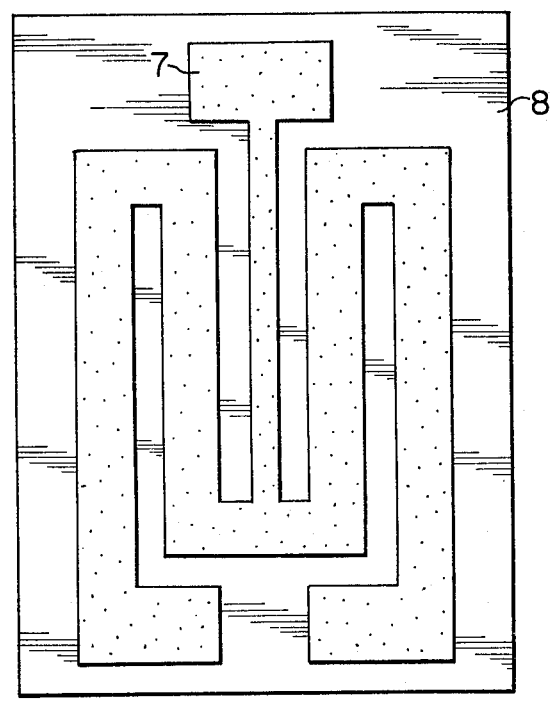
FIGS. 9A and 9B are plan views showing a manufacturing process of a semiconductor magnetoresistive element further embodying the present invention.
Figure 9B:
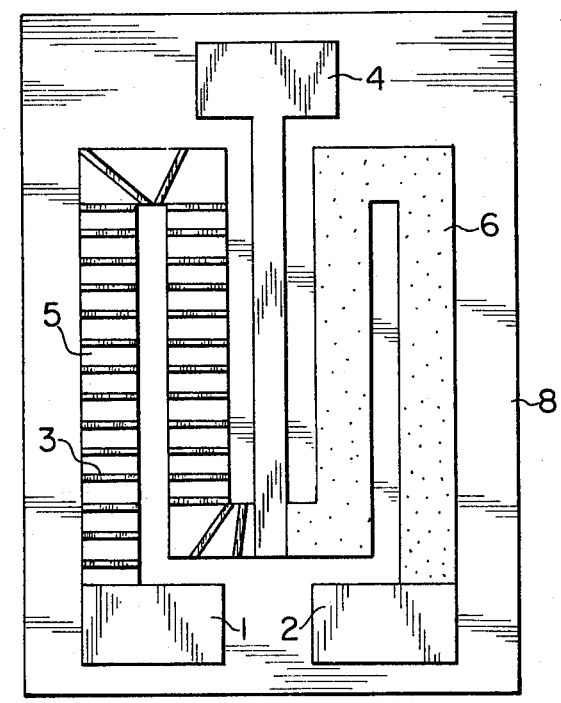

Referring now to FIGS. 9A to 9B, the present invention will be described in more detail by way of examples.

EXAMPLE 1

An InSb single crystalline material having an electron mobility of 70,000 cm$^2$/V·sec was sliced to wafers. The wafer had a size of 2 inch square. The wafer was bonded to a 1.0 mm thickness epoxy substrate and then lapped to a thickness of 6$\mu$.

This thin InSb plate was then coated with a photoresist, KTFR type manufactured by Kodak, and photoetched using a ferric chloride aqueous solution to be patterned as shown by reference numeral 7 in FIG. 9A. Reference numeral 8 designates a substrate, which is herein an epoxy substrate.

Thereafter, the type KTFR photoresist was applied again to a part of the pattern excepting room for the formation of electrodes and shorting bars, and the pattern was plated with a metal by electroless plating for deposition of 1$\mu$ thick copper and 0.2$\mu$ thick silver thereon, thereby forming first, second and third electrodes 1, 2 and 4 as well as shorting bars 3 having each a width of 30$\mu$ across the current path of a magnetosensitive portion 5 with an interspace of 100$\mu$.

Thirty elements were thus prepared on one-wafer substrate. The substrate was then cut out by die into thirty chips to leave separate individual elements having a chip size of 3 mm square. The separate chip of element was soldered at its electrodes 1, 2 and 4 with copper lead-out wires having a diameter of 0.1 mm and a length of 20 mm and the element as a whole was molded with epoxy resin type AER-331 manufactured by Asahi Chemical Industry Co., Ltd. Resistances between the first and third electrodes 1 and 4 and between the second and third electrodes 2 and 4 were 70Ω, respectively, in the absence of an applied magnetic field.

Next, one of the elements thus prepared was connected to a constant voltage source of 1 V through the first and second electrodes 1 and 2 and the entirety of this element was applied with a magnetic field having a magnetic flux density of 3 K Gauss, thus an output voltage of 260 mV being developed between the first and third electrodes 1 and 4. The output voltage changed at a rate of −0.2%/°C. around normal temperature which is practically negligible. The remainder of separate chip elements showed a similar characteristic.

EXAMPLE 2

A 1μ thick InSb thin film having an electron mobility of 21,000 cm$^2$/V·sec was formed by vapor deposition on a mica substrate maintained at 500° C. The deposited thin film was then transferred in 0.5μ thickness to a 0.5 mm thick, 2 inch square ceramic substrate and bonded thereto by an epoxy bonding agent.

Thereafter, this InSb thin film was photoetched through a similar process to Example 1 to be patterned as shown in FIG. 9A and electrodes and shorting bars as shown in FIG. 9B were formed on the pattern by electroless plating. Size and configuration of the element were the same as those of Example 1. In this manner, thirty elements according to this invention having a configuration as shown in FIG. 9B were prepared on one substrate.

Next, the substrate was cut out by die to leave thirty separate elements. The separate element was soldered at its electrodes with a 0.1 mm diameter, 20 mm length lead-out wire and the element as a whole was molded with the aforementioned AER-331. Thirty elements were prepared with each element having an average resistance of 3.1 kΩ between the first and third electrodes 1 and 4 and an average resistance of 3.1 kΩ between the second and third electrodes 2 and 4. One of the elements thus prepared was supplied with a fixed voltage of 1 V through the first and second electrodes and the entirety of this element was applied with a magnetic flux density of 3 k Gauss, thus an output voltage of 120 mV being developed from the third electrode. The output voltage changed at a rate of −0.18%/°C., eliminating the necessity of temperature compensation for the practical purposes.

EXAMPLE 3

A 1μ thick InSb thin film having an electron mobility of 21,000 cm$^2$/V·sec was formed by vapor deposition on a mica substrate maintained at 500° C.

The deposited thin film was then transferred to a 0.5μ thick Ni-Zn system ferrite substrate and bonded thereto by an epoxy bonding agent. The use of the magnetic substrate is advantageous in that the apparent magnetic field applied to the element can be increased.

Thereafter, this InSb thin film was etched to be patterned as shown by 7 in FIG. 9A and electrodes 1, 2 and 4 and shorting bars 3 were formed on the pattern by plating copper or silver in a similar manner to Example 1 to thereby prepare thirty elements having each a configuration as shown in FIG. 9B on the substrate. Next, the substrate was cut out by die, leaving separate chip elements. The separate element was soldered at its electrodes with a 0.1 mm diameter copper wire and molded with the aforementioned epoxy resin AER-331. One of the elements thus prepared was connected to a constant voltage source of 1 V through the first and second electrodes 1 and 2 and applied with a magnetic flux density of 3 K Gauss, so that an output voltage of 220 mV was measured between the first and third electrodes 1 and 4. The output voltage changed at a rate of −0.19%/°C.

We claim:

1. A small-size, semiconductor magnetoresistive element for providing a differential output in response to an applied magnetic field, comprising:
   (a) an insulating substrate,
   (b) a magnetoresistive portion comprising an elongated thin layer composed of a high-mobility semiconductor material and attached to the insulating substrate,
   (c) two input terminals comprising first and second electrodes respectively disposed at opposite ends of the semiconductor layer of the magnetosensitive portion in ohmic contact therewith,
   (d) an output terminal comprising an intermediate electrode connected to the magnetosensitive portion and in ohmic contact therewith between said first and second electrodes,
   (e) a plurality of shorting bars composed of an electrically conductive material and disposed in an electric isolation from each other on said semiconductor layer only between said first and intermediate electrodes, and
   (f) wherein said shorting bars are disposed to define adjoining patterned and non-patterned sections on the magnetosensitive portion and the intermediate electrode is disposed at the boundary of these sections, whereby in response to application of a uniform magnetic field over the entire magnetosensitive portion the rate of change in the resistance due to a magnetoresistive effect between the first and intermediate electrodes of the element is considerably greater than that between the second and intermediate electrodes, thereby providing a high differential output voltage compensated for the temperature variation due to the temperature variation in the magnetoresistance of the magnetosensitive portion.

2. A semiconductor magnetoresistive element according to claim 1, wherein said shorting bars all have the same length and are disposed with the same spacing.

3. A semiconductor magnetoresistive element according to claim 1, wherein said shorting bars traverse a current path in said magnetosensitive portion.

4. A semiconductor magnetoresistive element according to claim 1, wherein the intermediate electrode is positioned so that the resistance between said first and intermediate electrodes of the element is equal to that between said second and intermediate electrodes in the absence of a magnetic field.

5. A semiconductor magnetoresistive element according to claim 1, wherein said insulating substrate comprises an insulative ferromagnetic material.

6. A semiconductor magnetoresistive element according to claim 1, further comprising means molding and sealing the magnetosensitive portion comprising at least one member of material selected from the group consisting of resin, glass and ceramic.

7. A semiconductor magnetoresistive element according to claim 1, wherein said intermediate electrode is disposed at an extension from an intermediate location of said elongated semiconductor layer to provide a bonding pad structure.

8. A semiconductor magnetoresistive element according to claim 1, wherein said intermediate electrode is bonded on said semiconductor layer of the magnetosensitive portion along its current path between said first and second electrodes.

9. A semiconductor magnetoresistive element according to claim 1, wherein said elongated semiconductor layer has a smaller width between said second and intermediate electrodes than that between said first and intermediate electrodes.

10. A semiconductor magnetoresistive element according to claim 1, wherein said semiconductor thin-film layer has a thickness less than 6 $\mu$m.

11. A semiconductor magnetoresistive element according to claim 10, wherein said insulating substrate has an area of at most 3 mm square for applying said semiconductor thin-film layer.

12. A semiconductor magnetoresistive element according to claim 1, wherein said semiconductor material is one member selected from the group consisting of InSb, InAs, a eutectic substance of InSb and NiSb and a eutectic substance of InSb, In, $In_xSb_yGa_z$ ($x+y+z=1$) and $In_xSb_ySn_z$ ($x+y+z=1$).

13. A semiconductor magnetoresistance contactless switch device comprising:
(a) an insulating substrate having a predetermined surface area,
(b) a magnetosensitive portion comprising an elongated thin-film layer of a high-mobility semiconductor material attached on said surface area of the insulating substrate,
(c) two input terminals comprising first and second electrodes disposed along the length of the semiconductor layer of the magnetosensitive portion in ohmic contact therewith,
(d) an output terminal comprising an intermediate electrode connected to the magnetosensitive portion in ohmic contact therewith between said first and second electrodes,
(e) a pattern of spaced apart shorting bars of electrically conductive material disposed transversely and uniformly on the surface of said semiconductor layer only between said first and intermediate electrodes, and
(f) means having dimensions greater than that of said substrate for applying a magnetic field over the entire surface of said magnetosensitive portion, whereby upon application of the magnetic field over the magnetosensitive portion the rate of change in the resistance of said magnetosensitive portion between said first and said intermediate electrodes is substantially larger than that between said second and said intermediate electrodes to thereby produce a significantly large differential output voltage which is substantially temperature-compensated.

14. A semiconductor magnetoresistance contactless switch device according to claim 13, wherein said insulating substrate has a predetermined surface area of at most three millimeters square.

15. A semiconductor magnetoresistance contactless switch device according to claim 13, wherein said intermediate electrode is provided at a position such that the electrical resistance between said first and intermediate electrodes is equal to that between said second and intermediate electrodes in the absence of a magnetic field.

16. A semiconductor magnetoresistive element comprising:
(a) an insulating substrate,
(b) a magnetosensitive portion comprising an elongated current-carrying semiconductor region formed on said insulating substrate,
(c) first and second terminal electrodes coupled to said elongated semiconductor region at opposite ends thereof and in ohmic contact therewith,
(d) a pattern of shorting bars composed of electrically conductive material and disposed in geometric and electric isolation from each other on the semiconductor layer to define adjoining patterned and non-patterned sections along the magnetosensitive portions; and
(e) at least one intermediate terminal electrode coupled to said elongated semiconductor region between said first and second terminal electrodes in ohmic contact therewith at the boundaries of the patterned and non-patterned sections.

17. A semiconductor magnetoresistive element according to claim 16, further comprising means for applying a magnetic field over the entire magnetosensitive portion whereby a differential output is derived from said intermediate terminal electrode in response to a predetermined voltage applied across the first and second terminals.

18. A semiconductor magnetoresistive element according to claim 16, wherein the substrate has an area of not greater than 3 mm square.

* * * * *